United States Patent
Joe et al.

(10) Patent No.: US 8,102,692 B2
(45) Date of Patent: Jan. 24, 2012

(54) DATA STORAGE DEVICES USING MAGNETIC DOMAIN WALL MOVEMENT AND METHODS OF OPERATING THE SAME

(75) Inventors: In-sung Joe, Seoul (KR); Yoon-dong Park, Yongin-si (KR); Seung-hoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 636 days.

(21) Appl. No.: 12/222,504

(22) Filed: Aug. 11, 2008

(65) Prior Publication Data

US 2009/0207643 A1    Aug. 20, 2009

(30) Foreign Application Priority Data

Feb. 20, 2008  (KR) .................. 10-2008-0015467

(51) Int. Cl.
  *G11C 19/00* (2006.01)
(52) U.S. Cl. .......... 365/81; 365/148; 365/158; 365/171; 365/173; 977/933
(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | | | |
|---|---|---|---|---|---|
| 3,895,363 | A | * | 7/1975 | Braginski et al. | 365/2 |
| 4,070,651 | A | * | 1/1978 | Naden | 365/15 |
| 4,458,334 | A | * | 7/1984 | Hall | 365/1 |
| 4,954,803 | A | * | 9/1990 | Iijima et al. | 338/32 R |
| 7,133,312 | B2 | * | 11/2006 | Sakimura et al. | 365/173 |
| 2004/0252538 | A1 | * | 12/2004 | Parkin | 365/80 |
| 2005/0024950 | A1 | * | 2/2005 | Sakimura et al. | 365/189.07 |
| 2005/0078509 | A1 | * | 4/2005 | Parkin | 365/158 |
| 2005/0078511 | A1 | * | 4/2005 | Parkin | 365/171 |
| 2005/0201145 | A1 | * | 9/2005 | Baker | 365/158 |
| 2006/0120132 | A1 | * | 6/2006 | Parkin | 365/80 |
| 2008/0253161 | A1 | * | 10/2008 | Parkin et al. | 365/80 |

* cited by examiner

*Primary Examiner* — Richard Elms
*Assistant Examiner* — Harry W Byrne
(74) *Attorney, Agent, or Firm* — Harness, Dickey & Pierce, P.L.C.

(57) ABSTRACT

Data storage devices using movement of magnetic domain walls and methods of operating the same are provided. A data storage device includes a magnetic track having a verifying region. Within the verifying region, first and second magnetic domains are arranged alternately. The first magnetic domains correspond to first data and the second magnetic domains correspond to second data. A verification sensor is arranged at an end of the verifying region. A current applying element is configured to apply one or more pulse currents to the magnetic track. A first counter is connected to the verification sensor and configured to count the number of magnetic domains passing through the verification sensor.

20 Claims, 5 Drawing Sheets

DATA STORAGE DEVICES USING MAGNETIC DOMAIN WALL MOVEMENT AND METHODS OF OPERATING THE SAME

PRIORITY STATEMENT

This non-provisional patent application claims priority under 35 U.S.C. §119 to Korean Patent Application No. 10-2008-0015467, filed on Feb. 20, 2008, in the Korean Intellectual Property Office, the entire contents of which is incorporated herein by reference.

BACKGROUND

Description of the Related Art

Examples of conventional non-volatile data storage devices in which recorded data is retained even when power is cut off include hard disk drives (HDDs) and non-volatile random access memories (RAMs). A conventional HDD stores data using a rotating part, which may wear-down over time. This increases the possibility of operational failure, thereby reducing reliability.

A flash memory is an example of a conventional non-volatile RAM. Conventional flash memories have relatively slow reading and writing speeds, relatively short life spans, and relatively small storage capacities when compared to conventional HDDs. Conventional flash memories may also have relatively high manufacturing costs.

Another conventional data storage device uses principles of magnetic domain wall movement of a magnetic material. A minute magnetic region that constitutes a ferromagnetic substance is referred to as a magnetic domain. A boundary portion between magnetic domains having different magnetization directions is referred to as a magnetic domain wall. The magnetic domains and the magnetic domain walls may be moved-by a pulse current applied to a magnetic layer.

While the magnetic domains and the magnetic domain walls are being moved by the pulse current, a magnetic domain may disappear, two adjacent magnetic domains may be combined, and/or a single magnetic domain may be split into two magnetic domains. These occurrences may reduce the smoothness of the movement of the magnetic domains and the magnetic domain walls.

SUMMARY

Example embodiments relate to data storage devices and methods of operating the same, for example, data storage devices using magnetic domain wall movement and methods of operating the same.

According to at least one example embodiment, a data storage device may include a magnetic track and a verification sensor. The magnetic track may have a verifying region in which first and second magnetic domains corresponding to first and second data, respectively, may be arranged alternately. The verification sensor may be arranged at an end of the verifying region. The data storage device may further include a current applying element configured to apply a pulse current to the magnetic track, and a first counter connected to the verification sensor. The first counter may be configured to count the number of magnetic domains being passed through the verification sensor by the pulse current.

According to at least one other example embodiment, a data storage device may include a magnetic track and a verification sensor. The magnetic track may include a verifying region in which first and second magnetic domains are arranged alternately. The first magnetic domains may correspond to first data and the second magnetic domains may correspond to second data. The verification sensor may be arranged at an end of the verifying region. The data storage device may further include a current applying element configured to apply one or more pulse currents to the magnetic track, and a first counter connected to the verification sensor. The first counter may be configured to count the number of magnetic domains being passed through the verification sensor.

According to at least some example embodiments, the electrical current applying element may include a first current generator connected to an end of the magnetic track. The data storage device may further include a second counter connected to the first current generator. The second counter may be configured to count the number of pulse currents applied to the magnetic tracks by the first current generator. The data storage device may include a first logic device connected to the first counter and the second counter. The first logic device may compare the number of pulse currents applied to the magnetic tracks by the first current generator and the number of the magnetic domains being passed through the verification sensor by the pulse currents.

According to at least some example embodiments, the current applying element may include a second current generator connected to the other end of the magnetic track. The data storage device may further include a third counter connected to the second current generator. The third counter may be configured to count the number of pulse currents applied to the magnetic track by the second current generator.

According to at least some example embodiments, the data storage device may further include a second logic device connected to the first counter and the third counter. The second logic device may compare the number of pulse currents applied to the magnetic tracks by the second current generator and the number of the magnetic domains being passed through the verification sensor by the pulse currents. The magnetic track may include a buffer region extending from the end of the verifying region. The verification sensor may be a reading/writing unit capable of reading/writing data or a sensor for reading data only.

According to at least some example embodiments, the data storage device may further include a plurality of reading/writing units arranged on the magnetic track, wherein the verification sensor may be one of the reading/writing units. The verification sensor may be either the first or the last of the reading/writing units. The reading/writing units may be arranged at the same or substantially the same intervals. At least one of the reading/writing units may include a first and second pinned ferromagnetic layers formed on the top and rear surfaces of the magnetic track. Each of the first and second pinned ferromagnetic layers may be magnetized in a direction opposite from a direction in which the other is magnetized. First and second insulation spacers may be interposed between the first and second pinned ferromagnetic layers and the magnetic layer. A sense amplifier may be arranged between the verification sensor and the first counter.

According to at least one other example embodiment, a method of operating a data storage device may include applying one or more pulse currents to a magnetic track having a verifying region in which a first and second magnetic domains corresponding to first and second data, respectively. The first and second magnetic domains may be arranged alternately. The method may further include counting the number of magnetic domains passing through an end of the verifying region.

At least one other example embodiment provides a method of operating a data storage device. According to at least this example embodiment, one or more pulse currents may be applied to a magnetic track. The magnetic track may include a verifying region in which first and second magnetic domains are arranged alternately. The first magnetic domains may correspond to first data and the second magnetic domains may correspond to second data. A number of magnetic domains passing through a verification sensor arranged at an end of the verifying region may be counted.

According to at least some example embodiments, the number of pulse currents applied to the magnetic track may be counted by counting the number of the magnetic tracks passing through the end of the verifying region. The method may further include comparing the number of the magnetic domains passing the end of the verifying region and the number of pulse currents applied to the magnetic track. The data storage device may include a verification sensor arranged at an end of the verifying region, and a first counter connected to the verification sensor. The first counter may count the number of magnetic domains being moved by the pulse current and passing through the verification sensor. The data storage device may include a plurality of reading/writing units arranged on the magnetic track. At least one of the reading/writing units may be the verification sensor. The verification sensor may be either the first or the last of the reading/writing units. The reading/writing units may be arranged at the same or substantially the same intervals.

According to at least some example embodiments, at least one of the reading/writing units may include first and second pinned ferromagnetic layers. The first and second pinned ferromagnetic layers may be formed on the top and rear surfaces of the magnetic track. Each of the first and second pinned ferromagnetic layers may be magnetized in a direction opposite from a direction in which the other is magnetized. First and second insulation spacers may be interposed between respective first and second pinned ferromagnetic layers and the magnetic layer.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
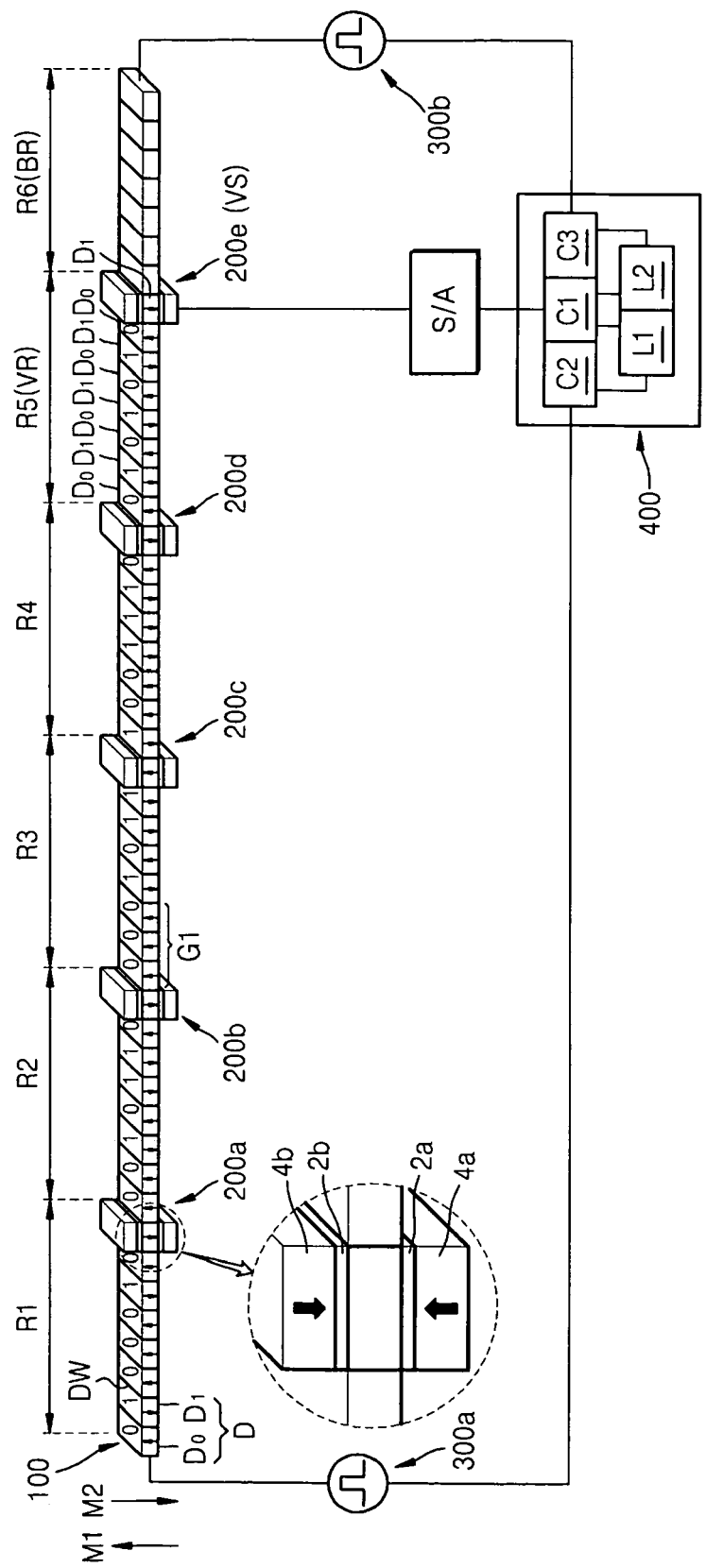
FIG. 1 is an oblique view of a data storage device using movement of magnetic domain walls according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Data storage devices using movement of magnetic domain wall movement and methods of operating data storage devices according to example embodiments will now be described more fully with reference to the accompanying drawings. In the drawings, the thicknesses of layers and regions are exaggerated for clarity. Like reference numerals in the drawings denote like elements FIG. 1 is an oblique view of a magnetic domain data storage device according to an example embodiment.

Referring to FIG. 1, an example embodiment of a data storage device may include a magnetic track 100. The magnetic track 100 may include a plurality of magnetic domains D. A magnetic domain wall DW may be arranged between each pair of adjacent magnetic domains D. The magnetic track 100 may be a track composed of a ferromagnetic material, for example, a hard magnetic material. The magnetic track 100 may be arranged parallel or substantially parallel to a substrate (not shown) and may have perpendicular magnetic anisotropy. However, example embodiments are not limited thereto. For example, the magnetic track 100 may be formed of a soft magnetic material, may have horizontal magnetic anisotropy, and/or may have various structures.

A plurality of reading/writing units, for example, first through fifth reading/writing units 200a through 200e may be arranged on the magnetic track 100. Structures of the first through fifth reading/writing units 200a through 200e will be described in more detail below. The first through fifth reading/writing units 200a through 200e may be arranged at the same or substantially the same intervals. Due to the first through fifth reading/writing units 200a through 200e, the magnetic track 100 may be split into a plurality of small unitary regions, for example, first through sixth regions R1 through R6. At least one of the first through sixth regions R1 through R6 (e.g., the region R5 second from the right in FIG. 1) may be a verifying region. Hereinafter, the fifth region R5 will be referred as the verifying region VR for example purposes. Although the fifth region R5 is used as the verifying region VR in this example embodiment, the region R2 second from the left (or any other region for that matter) may serve as the verifying region VR in other example embodiments.

The fifth region R5, used as the verifying region VR, may be a region in which magnetic domains corresponding to first data (identified as magnetic domains with number '0' on the top and referred to as first magnetic domains $D_0$ hereinafter) and magnetic domains corresponding to second data (identified as magnetic domains with number '1' on the top and referred to as second magnetic domains $D_1$ hereinafter) may be arranged alternately. The first and second magnetic domains $D_0$ and $D_1$ may be regions magnetized in a first direction M1 and in a second direction M2, respectively. The first and second directions M1 and M2 may be opposite. The first and second magnetic domains $D_0$ and $D_1$ may correspond to data '0' and data '1', respectively. Regions other than the verifying region VR may be magnetized in given, desired or pre-determined directions. In FIG. 1, the magnetic domains D of the first through fourth regions R1 through R4 may be magnetized in the first direction M1 or the second direction M2. Arrows on the sides of the magnetic domains D indicate the direction in which a magnetic domain D is magnetized. The magnetization directions of the magnetic domains D of the first through fourth regions R1 through R4 are merely examples, but the magnetic domains D of the first through fourth regions R1 through R4 may be magnetized in different directions.

The fifth reading/writing unit 200e, arranged at an end of the verifying region VR, may be a sensor for verification (referred to herein as a verification sensor). Although the fifth reading/writing unit 200e is used as the verification sensor in this example, the first reading/writing unit 200a (or any other reading/writing unit) may be used as a verification sensor in other example embodiments. In one alternative example, the first reading/writing unit 200a may serve as the verification sensor when the second region R2 is used as the verifying region VR. Example embodiments will be described with regard to the fifth reading/writing unit 200e as the verification sensor VS.

The sixth region R6 extending from the end of the verifying region VR may be used as a buffer region for temporarily storing data. In other example embodiments in which the second region R2 is the verifying region VR, the first region R1 may be used as a buffer region. Hereinafter, the sixth region R6 will be referred as a buffer region BR. Regions other than the fifth region R5 and the sixth region R6 may serve as effective storage regions. Although an occupation ratio of the effective storage region may be approximately two-thirds of the magnetic track 100, the occupation ratio of the effective storage region may be more than about 80% of the magnetic track 100 by increasing the number of reading/writing units to more than the first through fifth the reading/writing units 200a through 200e.

Still referring to FIG. 1, at least one end of the magnetic track 100 may be connected to a current applying element. The current applying element may include a first current generator 300a and a second current generator 300b. The first current generator 300a may be connected to an end of the magnetic track 100. The second current generator 300b may be connected to the other end of the magnetic track 100. The first and second current generators 300a and 300b may generate a pulse current. The magnetic domains D and the magnetic domain walls DW may be moved in a given, desired or pre-determined direction by applying the pulse current from the first and/or second current generators 300a and 300b to the magnetic track 100. The magnetic domains D and the magnetic domain walls DW may move in a direction opposite to a direction in which the pulse current flows; a direction in which electrons move. In alternative example embodiments, one of the first and second current generators 300a and 300b may be omitted. If the first current generator 300a is omitted, the second current generator 300b may be a unit capable of generating both a positive and a negative pulse current. If the second current generator 300b is omitted, the first current generator 300a may be a unit capable of generating both a positive and a negative pulse current.

Still referring to FIG. 1, the data storage device may further include a first counter C1 connected to the verification sensor VS. The first counter C1 may count the number of first and second magnetic domains $D_0$ and $D_1$ that pass through the verification sensor VS as a result of the applied pulse current. Because the verifying region VR is a region in which the first and second magnetic domains $D_0$ and $D_1$ are alternately arranged, movement of a magnetic domain is detected when the first and second magnetic domains D0 and D1 in the verifying region VR change by a bit. The first counter C1 may count the number of first and second magnetic domains $D_0$ and $D_1$ passing through the verification sensor VS by detecting the number of times a magnetization direction of the magnetic track 100 changes. According to at least this example embodiment, the sensor for verification VS may be disposed on the magnetic track 100.

A sense amplifier S/A may be arranged between the verification sensor VS and the first counter C1. In an example data reading operation (or a verifying operation), an electrical signal output from the verification sensor VS (e.g., a current signal) may be converted to a digital signal (e.g., a voltage signal) by the sense amplifier S/A and transmitted to the first counter C1.

Referring still to FIG. 1, the data storage device may further include second and third counters C2 and C3 connected to the first and second current generators 300a and 300b, respectively. The second counter C2 may count the number of pulse currents applied by the first current generator 300a to the magnetic track 100. The third counter C3 may count the number of pulse currents applied by the second current generator 300b to the magnetic track 100.

Because the circuit configurations of the first through third counters C1 through C3 are well-known detailed descriptions thereof will be omitted.

Data storage devices according to at least this example embodiment may include a first logic device L1 and a second logic device L2. The first logic device L1 may be connected to the first and second counters C1 and C2. The second logic device L2 may be connected to the second and third counters C2 and C3. The first logic device L1 may compare the number of pulse currents applied by the first current generator 300a (counted by counter C2) with the number of first and second magnetic domains $D_0$ and $D_1$ (counted by counter C1). As noted above, the first and second magnetic domains $D_0$ and $D_1$ may be moved by the pulse currents and pass the verification sensor VS.

The first logic device L1 may determine whether the number of pulse currents applied by the first current generator 300a to the magnetic track 100 and the number of first and second magnetic domains $D_0$ and $D_1$ that pass the verification sensor VS are the same or different. If the number of applied pulse currents is different from the number of first and second magnetic domains $D_0$ and $D_1$ that pass the verification sensor VS, the first logic device L1 may determine the value of the difference and output the result of the determination. Functions of the second logic device L2 are similar or substantially similar to those of the first logic device L1, but the second logic device L2 may compare the number of first and second magnetic domains $D_0$ and $D_1$ that pass the verification sensor VS with the number of pulse currents applied by the second current generator 300b. The first and second logic devices L1 and L2 may be, for example, exclusive OR (XOR) devices. Because XOR devices are well-known in the art, a detailed description thereof will be omitted. The first through third counters C1 through C3 and the first and second logic devices L1 and L2 may be arranged in a controller 400. The controller 400 may further include an address mapping function.

The number of pulse currents applied to the magnetic track 100 (hereinafter referred as a first quantity) and the number of first and second magnetic domains $D_0$ and $D_1$ in the verifying region VR, which have passed the verification sensor VS in response to the pulse currents (hereinafter referred as a second quantity), may be calculated by the data storage device according to an example embodiment. If the first quantity and the second quantity are the same or substantially the same, the magnetic domains D and the magnetic domain walls DW may be said to move normally. Otherwise, an error in moving the magnetic domains D and the magnetic domain walls DW has occurred. Therefore, example embodiments may be utilized to confirm whether the magnetic domains D and the magnetic domain walls DW have been moved normally. Example embodiments may also be utilized to determine the distance and the direction of the movement of the magnetic domains D on the magnetic track 100. From this determined distance and direction, data positioning may be determined.

Referring to the magnified section of FIG. 1, the first through fifth reading/writing units 200a through 200e may each include a first ferromagnetic layer 4a formed on a top surface of the magnetic track 100, and second ferromagnetic layer 4b formed on the bottom surface of the magnetic track 100. The first and second ferromagnetic layers 4a and 4b may be pinned layers. The first ferromagnetic layer 4a may be magnetized in a direction opposite to the magnetization direction of the second ferromagnetic layer 4b. Arrows shown on the first and second ferromagnetic layers 4a and 4b indicate a magnetization direction of a corresponding layer. A first insulation spacer 2a may be interposed between the first ferromagnetic layer 4a and the magnetic track 100. A second insulation spacer 2b may be interposed between the second ferromagnetic layer 4b and the magnetic track 100. The first and second insulation spacers 2a and 2b may be oxide layers, and may be formed with a sufficiently small thickness such that tunneling of electrons may occur through the first and second insulation spacers 2a and 2b.

Hereinafter, a data writing mechanism by using the first through fifth reading/writing units 200a through 200e, according to at least one example embodiment, will be described with reference to FIGS. 2A and 2B.

Figure 2A:
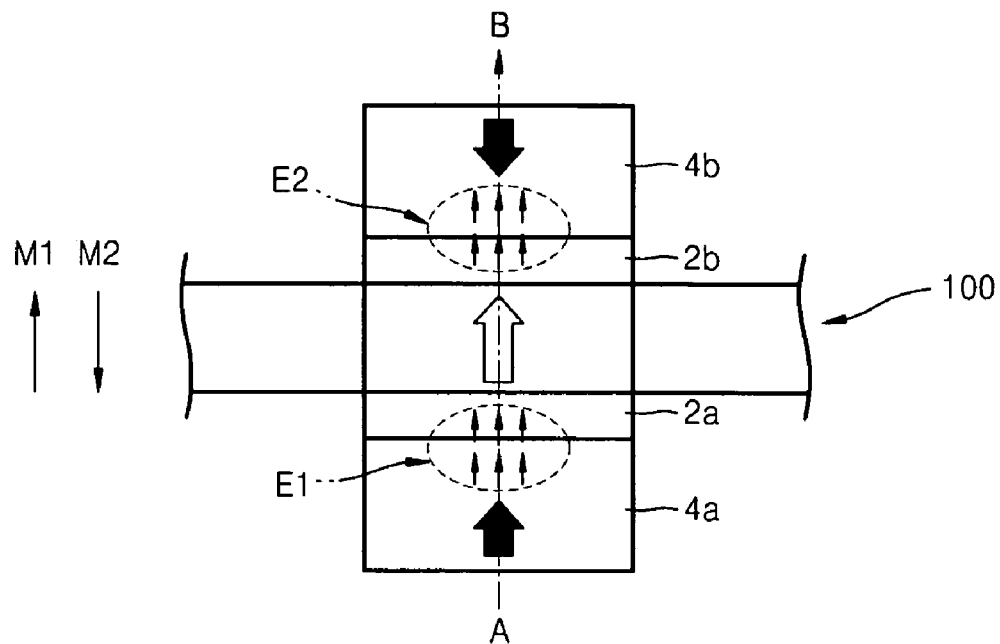
FIGS. 2A and 2B are sectional views for describing a data writing method performed by a reading/writing unit included in the data storage device according to an example embodiment.

Referring to FIG. 2A, when electrons move from the first ferromagnetic layer 4a to the second ferromagnetic layer 4b (from A toward B), electrons E1 magnetized in the same direction as the first ferromagnetic layer 4a (denoted as M1 and referred to as the first direction M1) move toward the magnetic track 100. This results in the occurrence of a spin transfer torque effect, which magnetizes the magnetic track 100 in the first direction M1.

In the second ferromagnetic layer 4b, electrons magnetized in the same direction as the second ferromagnetic layer 4b (denoted as M2 and referred to as the second direction M2) escape from the second ferromagnetic layer 4b. But, electrons E2 magnetized in the direction opposite to the second ferromagnetic layer 4b do not escape from the second ferromagnetic layer 4b. Instead, these electrons E2 return to the magnetic track 100 and accumulate. This results in the occurrence of a spin accumulation effect, which magnetizes the magnetic track 100 in the first direction M1.

Accordingly, first data can be written to the magnetic track 100 due to the spin transfer torque effect and the spin accumulation effect.

Figure 2B:
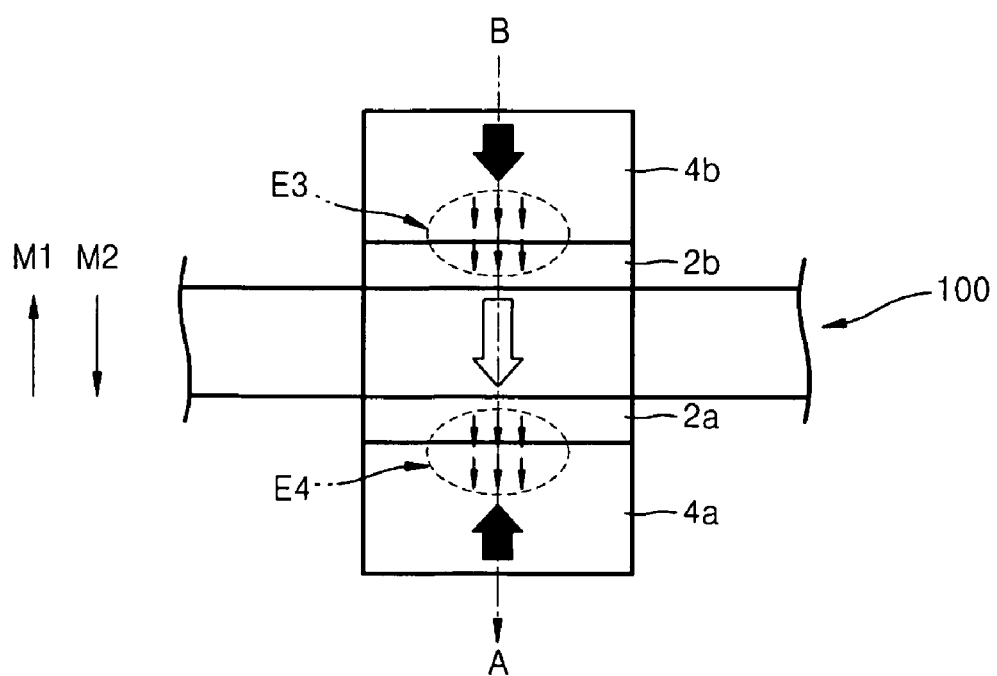

Referring to FIG. 2B, when electrons move from the second ferromagnetic layer 4b to the first ferromagnetic layer 4a, electrons E3 magnetized in the second direction M2 may move toward the magnetic track 100. The electrons E3 magnetize the magnetic track 100 in the second direction M2. In the first ferromagnetic layer 4a, electrons magnetized in the first direction M1 escape from the first ferromagnetic layer 4a, whereas electrons E4 magnetized in the second direction M2 do not escape from the first ferromagnetic layer 4a. Instead, the electrons E4 return to the magnetic track 100 and accumulate. The accumulated electrons E4 magnetize the magnetic track 100 in the second direction M2 to write second data to the magnetic track 100.

As described above, because the data storage device according to at least this example embodiment may include first and second ferromagnetic layers 4a and 4b, each of which is magnetized in a direction opposite to that of the other, data is written due to a spin transfer torque effect and/or the spin accumulation effect. Therefore, a writing current density may decrease as compared to a case in which a data storage device includes a single pinned ferromagnetic layer.

According to example embodiments, data may be written to the magnetic track 100 while moving the magnetic domains D and the magnetic domain walls DW bit-by-bit. In the data storage device shown in FIG. 1, new data may be written using the first through fourth reading/writing units 200a through 200d while moving the magnetic domains D in the first through fifth regions R1 through R5 to the second through sixth regions R2 through R6. As a result of the above data writing operation, the magnetic domains D in the first through fourth regions R1 through R4 may move to the second through fifth regions R2 through R5 and new data may be stored in the magnetic domains D. While performing the data writing operation, the fifth reading/writing unit 200e may perform a data verifying operation similar or substantially similar to a data reading operation.

After completing a data writing operation, the magnetic domains D, which moved to the second through sixth regions R2 through R6, may return to the first through fifth regions R1 through R5. The data verifying operation may also be performed while returning the magnetic domains D in the second through sixth regions R2 through R6 to the first through fifth regions R1 through R5.

A data reading operation using the first through fifth reading/writing units 200a through 200e according to an example embodiment will be described below. In FIG. 1, the electrical resistance between the first ferromagnetic layer 4a or the second ferromagnetic layer 4b of the first reading/writing unit 200a and an opposite end of the magnetic track 100 may be measured. The electrical resistance may vary according to data written to the magnetic track 100. Data written to the magnetic track 100 may be read by measuring the electrical resistance. According to an example embodiment, data written to the magnetic track 100 may be produced by moving the magnetic domains D and magnetic domain walls DW bit-by-bit. Data written to the magnetic track 100 may also be read by measuring the electrical resistance between the first ferromagnetic layer 4a and the second ferromagnetic layer 4b, instead of measuring the electrical resistance between the first ferromagnetic layer 4a or the second ferromagnetic layer 4b of the first reading/writing unit 200a and an opposite end of the magnetic track 100. In this example, current applied for reading data may be smaller than current used in the data writing operation, and thus data written to the magnetic track 100 may be maintained when performing the data reading operation.

Data reading operations respectively using the second through the fifth reading/writing units 200b through 200e may be the same or substantially the same as above. Additionally, when current is applied to the magnetic track 100 to move the magnetic domains D and the magnetic domain walls DW, the first and second insulation spacers 2a and 2b may function as electrical barriers. As a result, the leakage of current for moving the magnetic domains D and the magnetic domain walls DW into the first and second ferromagnetic layers 4a and 4b may be suppressed and/or prevented.

The structure and principles of the first through fifth reading/writing units 200a through 200e described above are not limited thereto, but may vary. In the data storage device shown in FIG. 1, for example, data may be read by using the first through fourth reading/writing units 200a through 200d simultaneously or concurrently while moving the magnetic domains D in the first through fifth regions R1 through R5 to the second through sixth regions R2 through R6 bit-by-bit. While performing a data reading operation performed, a data verifying operation may be performed using the fifth reading/writing unit 200e. After completing the data reading operation, the magnetic domains D, which have moved to the second through sixth regions R2 through R6, may return to the first through fifth regions R1 through R5. The data verification operation may also be performed while moving the magnetic domains D in the second through sixth regions R2 through R6 to the first through fifth regions R1 through R5.

Although not shown, data storage devices according other example embodiments may include a plurality of magnetic tracks, each of which is equivalent or substantially equivalent to the magnetic track 100 shown in FIG. 1. In this example, the magnetic tracks may be arranged in a parallel or substantially parallel direction and/or a direction vertical or substantially vertical relative to a substrate. The first and second current generators 300a and 300b and the controller 400 may be commonly connected to two or more of the magnetic tracks. Switching devices may be arranged between the first and second current generators 300a and 300b and the magnetic tracks. Switching devices may also be arranged between the controller 400 and the magnetic tracks. A particular magnetic track for performing the reading/writing operation may be selected from among the magnetic tracks by the switching device.

Figure 3:
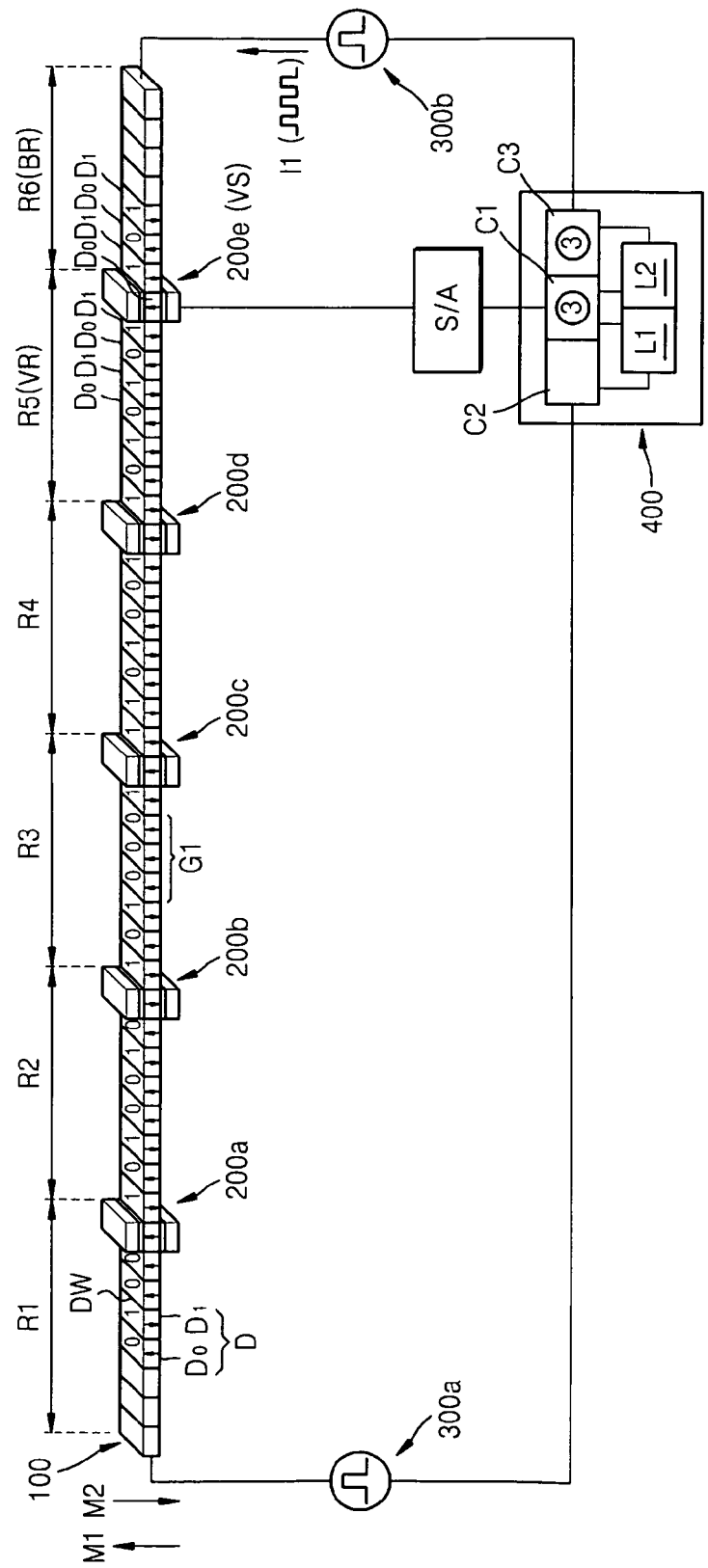
FIGS. 3 through 5 are oblique views for describing a method of operating the data storage device using movement of magnetic domain walls according to an example embodiment.
Figure 4:
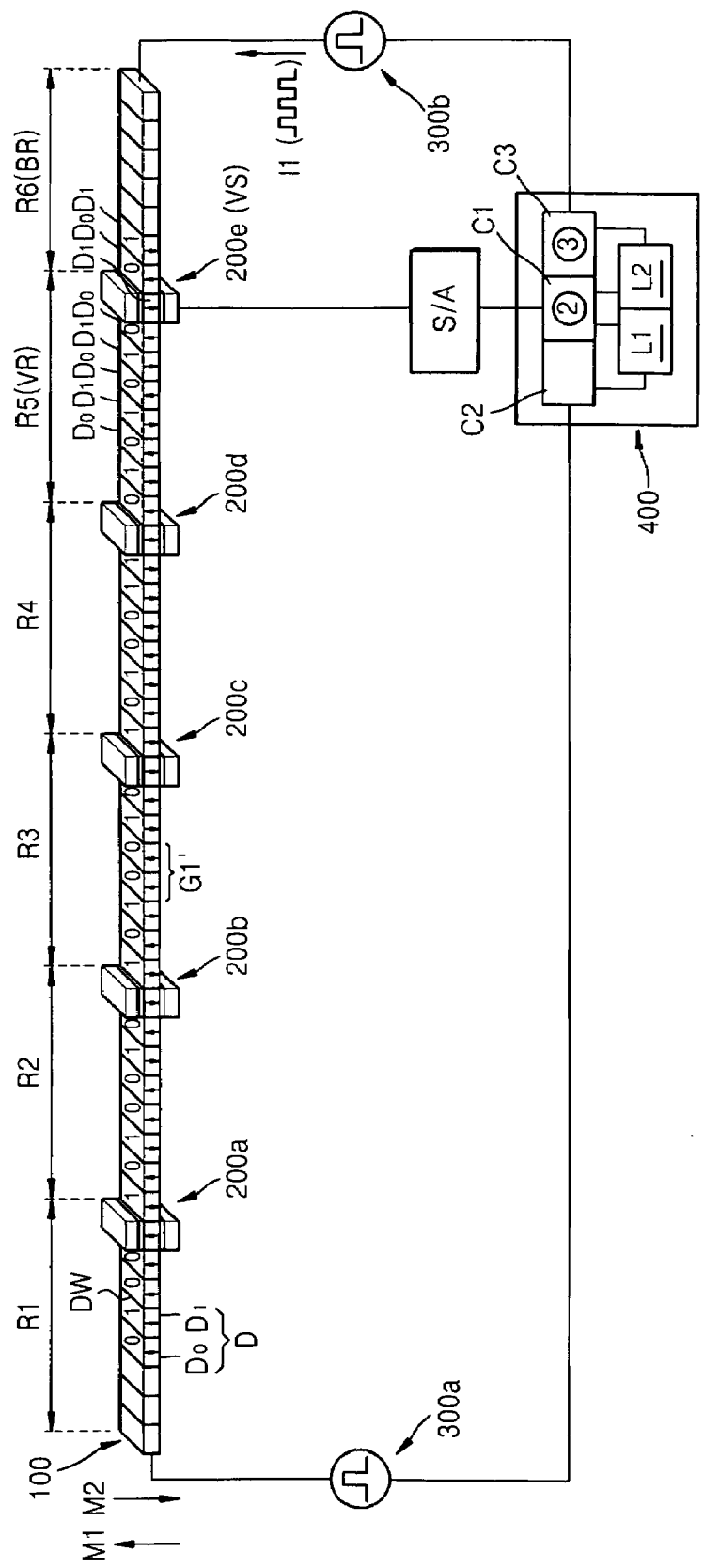
Figure 5:
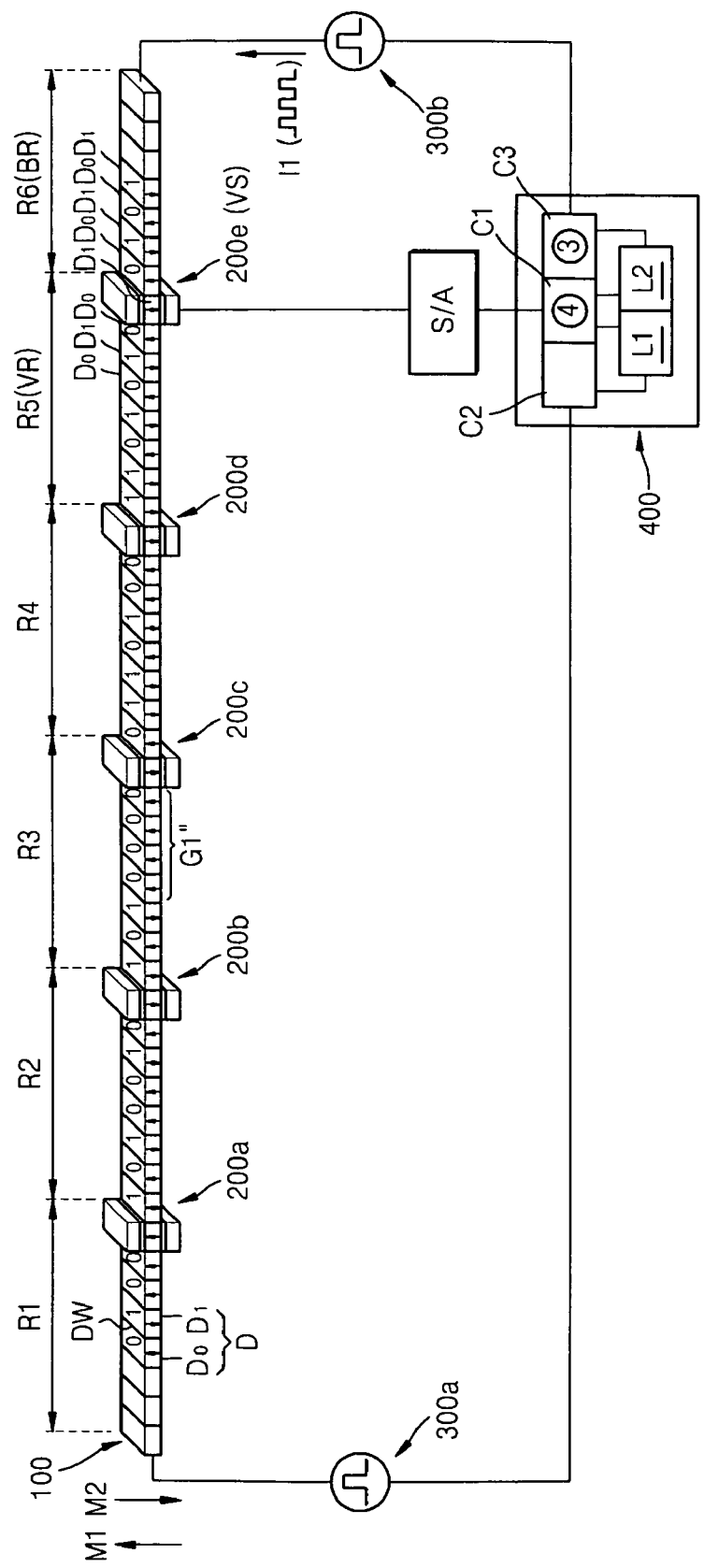

FIGS. 3 through 5 are oblique views for describing methods of operating data storage devices according to example embodiments. FIGS. 3 through 5 all show results of moving the magnetic domains D and the magnetic domain walls DW by applying a pulse current to the magnetic track 100 shown in FIG. 1. FIG. 3 is a diagram showing an example in which the magnetic domains D and the magnetic domain walls DW are moved normally without error, whereas FIGS. 4 and 5 are diagrams showing examples in which the magnetic domains D and the magnetic domain walls DW are moved abnormally with errors.

Referring to FIG. 3, a first electrical current I1, including a plurality of (e.g., three) pulse currents, may be applied to the magnetic track 100 by the second current generator 300b. Due to the first electrical current I1, the magnetic domains D may move in the magnetic track 100 toward the buffer region BR for a distance equal or substantially equal to three magnetic domains D. The magnetic domains D move toward the buffer region BR because the magnetic domains D move in a direction opposite to the direction of the first electrical current I1. The number of first and second magnetic domains $D_0$ and $D_1$ that pass through the verification sensor VS may be counted by the first counter C1. Thus, the number three on the first counter C1 in FIG. 3 indicates that the number of first and second magnetic domains $D_0$ and $D_1$ that have passed through the verification sensor VS is three.

The number of pulse currents applied by the second current generator 300b to the magnetic track 100, may be counted by the third counter C3. Thus, the number three on the third counter C3 in FIG. 3 indicates that the number of pulse currents applied to the magnetic track 100 by the second current generator 300b is three. Because the number counted by the first counter C1 (three) and the number counted by the third counter C3 (three) are the same, the magnetic domains D and the magnetic domain walls DW are determined to move normally.

Referring to FIG. 4, the first electrical current I1, including a plurality of (e.g., three) pulse currents, may be applied by the second current generator 300b to the magnetic track 100. Due to the first electrical current I1, the magnetic domains D move in the magnetic track 100 toward the buffer region BR. However, the number of first and second magnetic domains $D_0$ and $D_1$ that have passed through the verification sensor VS is two. In this example, the number counted by the third counter C3 is three, whereas the number counted by the first counter C1 is two. The numbers counted by the first and third counters C1 and C3 are different, and the difference may be detected by the second logic device L2 when comparing the values of the counters C1 and C3. The difference in the numbers indicates that an error occurred while moving the magnetic domains D and the magnetic domain walls DW. The cause of the error may be, for example, disappearance of magnetic domain D while moving the magnetic domains D and the magnetic domain walls DW. For example, a first magnetic domain group G1 (shown in FIG. 1) may be changed while being moved, and may become a first magnetic domain group G1' (shown in FIG. 4). The first magnetic domain group G1, including three successive first magnetic domains $D_0$ in FIG. 1, may be maintained in FIG. 3, but not in FIG. 4. The first magnetic domain group G1' shown in FIG. 4 includes two of the first magnetic domains $D_0$. Therefore, one of the first magnetic domains $D_0$ forming the first magnetic domain group G1 shown in FIG. 1 has disappeared.

Referring to FIG. 5, in this example although the first electrical current I1, including three pulse currents, is applied to the magnetic track 100 by the second current generator 300b, the number of first and second magnetic domains $D_0$ and $D_1$ that pass through the verification sensor VS is four. The difference between the number of applied pulse currents and the number of magnetic domains that have passed through the verification sensor VS is indicative that an error has occurred. The reason for the fourth magnetic domain may be, for example, either generation of a new magnetic domain or dividing of one of the magnetic domains D into two magnetic domains while moving the magnetic domains D and the magnetic domain walls DW.

For example, a first magnetic domain group G1 shown in FIG. 1 may be changed while being moved and may become a first magnetic domain group G1" shown in FIG. 5. The first magnetic domain group G1" shown in FIG. 5 may include four of the first magnetic domains $D_0$. Therefore, one of the first magnetic domains $D_0$ forming the first magnetic domain group G1 shown in FIG. 1 has been divided into two.

When errors (e.g., as shown in FIGS. 4 and 5) occur, the portion of the magnetic track 100 on which the errors occurred, may be restored to a state prior to the error. The restoring operation may include re-writing the original data.

Also, if the method of verifying a data storage device according to example embodiments is used with either error correction codes and/or error detection methods used in the data communication field or the hard disk drive (HDD) field, an error may be corrected more easily, and reliability of data may be improved.

Additionally, the verifying region VR shown in FIG. 1 is a region in which the first and second magnetic domains $D_0$ and $D_1$ may be alternately arranged, but not a region in which the magnetic domains $D_0$ of the same type are arranged successively as is the case with the first magnetic domain group G1 shown in FIG. 1. Thus, it is relatively unlikely that errors occur in the verifying region VR when moving the magnetic domains D.

While example embodiments have been particularly shown and described with reference to the example embodiments shown in the drawings, it will be understood by one skilled in the art that various changes in form and details may be made therein without departing from the spirit and scope of the present invention as defined by the appended claims. Example embodiments described herein should be considered in descriptive sense only and not for purposes of limitation. For example, various changes may be made to the structure shown in FIG. 1, the components of the structure may be further complicated, a device having a reading function only (e.g., a tunnel magneto resistance (TMR) sensor or a giant magneto resistance (GMR) sensor) may be used as the verification sensor VS, and/or the first through fifth reading/writing units 200a through 200e may be modified otherwise. Therefore, the scope of the present invention is defined not by the detailed description of example embodiments, but by the appended claims, and all differences within the scope will be construed as being included in the present invention.

What is claimed is:

1. A data storage device comprising:
   a magnetic track having a verifying region in which first and second magnetic domains are arranged alternately, the first magnetic domains corresponding to a first data value and the second magnetic domains corresponding to a second data value;
   a verification sensor arranged at an end of the verifying region;
   a current applying unit configured to apply one or more pulse currents to the magnetic track to move magnetic domains within the magnetic track; and
   a first counter connected to the verification sensor, the first counter being configured to count a number of magnetic domains passing through the verification sensor by detecting a number of changes in magnetization direction of the magnetic track.

2. The data storage device of claim 1, wherein the current applying unit includes,
   a first current generator connected to an end of the magnetic track.

3. The data storage device of claim 2, further comprising:
   a second counter connected to the first current generator, the second counter being configured to count a number of pulse currents applied to the magnetic track by the first current generator.

4. The data storage device of claim 3, further comprising:
   a first logic device connected to the first counter and the second counter, the first logic device being configured to compare the number of pulse currents applied by the first current generator and the number of magnetic domains passing through the verification sensor.

5. The data storage device of claim 2, wherein the current applying unit further includes,
   a second current generator connected to an opposite end of the magnetic track.

6. The data storage device of claim 5, further comprising:
   a third counter connected to the second current generator, the third counter being configured to count a number of pulse currents applied to the magnetic track by the second current generator.

7. The data storage device of claim 6, further comprising:
   a second logic device connected to the first counter and the third counter, the second logic device being configured to compare the number of pulse currents applied by the second current generator and the number of magnetic domains passing through the verification sensor.

8. The data storage device of claim 1, wherein the magnetic track includes;
   a buffer region extending from the end of the verifying region.

9. The data storage device of claim 1, wherein the verification sensor is a reading/writing unit or a sensor configured to read data only, the reading/writing unit being configured to at least one of read and write data.

10. The data storage device of claim 1, further comprising:
    a plurality of reading/writing units disposed on the magnetic track; wherein the verification sensor is one of the reading/writing units.

11. The data storage device of claim 10, wherein the verification sensor is arranged at an end of the magnetic track.

12. The data storage device of claim 10, wherein the plurality of reading/writing units are spaced apart from one another at the same interval.

13. The data storage device of claim 10, wherein at least one of the plurality of reading/writing units includes,
    a first pinned ferromagnetic layer formed on a top surface of the magnetic track, the first pinned ferromagnetic layer being magnetized in a first direction,
    a second pinned ferromagnetic layer formed on a bottom surface of the magnetic track, the second pinned ferromagnetic layer being magnetized in a second direction opposite to the first direction,
    a first insulation spacer interposed between the first pinned ferromagnetic layer and the magnetic track, and a second insulation spacer interposed between the second pinned ferromagnetic layer and the magnetic track.

14. The data storage device of claim 1, further comprising: a sense amplifier arranged between the verification sensor and the first counter.

15. A method of operating a data storage device, the method comprising:
applying one or more pulse currents to a magnetic track, the magnetic track including a verifying region in which first and second magnetic domains are arranged alternately, the first magnetic domains corresponding to first data and the second magnetic domains corresponding to second data; and
counting a number of magnetic domains passing through a verification sensor arranged at an end of the verifying region.

16. The method of claim 15, further comprising: counting a number of the pulse currents applied to the magnetic track.

17. The method of claim 16, further comprising: comparing the number of the magnetic domains that passed through the verification sensor with the number of the pulse currents applied to the magnetic track.

18. The method of claim 15, wherein the data storage device includes,
a first counter connected to the verification sensor, the first counter configured to count the number of magnetic domains passing through the verification sensor.

19. The method of claim 15, wherein the data storage device includes,
a plurality of reading/writing units arranged on the magnetic track, wherein
at least one of the reading/writing units is the verification sensor disposed at the end of the verifying region.

20. The method of claim 19, wherein the verification sensor is arranged at an end of the magnetic track.

* * * * *